United States Patent [19]

Eakin

[11] 4,138,675

[45] Feb. 6, 1979

[54] FREEZING POINT MONITORING SYSTEM FOR FRUIT TREES AND THE LIKE

[75] Inventor: William F. Eakin, Union Gap, Wash.

[73] Assignee: Eakin Fruit Company, Union Gap, Wash.

[21] Appl. No.: 784,342

[22] Filed: Apr. 4, 1977

[51] Int. Cl.² ............................................. G08B 21/00
[52] U.S. Cl. ........................................ 340/596; 47/2; 324/65 P
[58] Field of Search ............. 47/2; 340/228 R, 227 R, 340/234; 324/65 P

[56] References Cited

U.S. PATENT DOCUMENTS

| | | | |
|---|---|---|---|
| 3,582,921 | 6/1971 | Krieger | 340/228 R |
| 4,024,495 | 5/1977 | O'Brien | 340/227 R |

OTHER PUBLICATIONS

Lumis, G. R. & Mecklenburg, R. A., "Freezing Patterns in Twigs of Evergreen Azalea", *J. Amer. Hort. Soc.* 99(6), 564–567.
Fensom, D. S., "A Note on Electrical Resistance Measurements in Acer Saccharum", *Canadian J. of Botany*, vol. 38, pp. 263–264.

*Primary Examiner*—Glen R. Swann, III
*Attorney, Agent, or Firm*—B. P. Fishburne, Jr.

[57] ABSTRACT

The present invention is directed to the method and apparatus for monitoring the electrical resistance characteristic of tree tissue which undergoes a step change of resistance at the "freezing" point. The resistance of the tissue is monitored by converting the resistance magnitude sensed to an electrical signal whose frequency is controlled in accordance with the magnitude of the sensed resistance. The frequency of the electrical signal is detected and a control signal generated in accordance with a predetermined frequency change in a set time period which is accordingly indicative of the step change of tissue resistance. The control signal is thus adapted to activate an alarm device or provide some other indication so that precautionary measures can be taken to protect trees, and more particularly fruit bearing trees from crop damage.

17 Claims, 5 Drawing Figures

4,138,675

FREEZING POINT MONITORING SYSTEM FOR FRUIT TREES AND THE LIKE

BACKGROUND OF THE INVENTION

1. Field of the Invention

This invention relates generally to a frost monitoring and alarm system for plant husbandry and more particularly to a system which is used for the prevention of damage to fruit trees and other plants by local weather conditions, namely freezing temperatures.

2. Description of the Prior Art

Frost protection for orchards is a vital part of management in many fruit growing areas. With citrus and stone fruits, in particular, crop damage with resulting economic loss results if the buds, blossom or small fruits are frozen. For years the practice has been to heat these orchards when temperatures drop to the point at which tissue freezing commences. Heating methods have consisted largely of burning fossil fuels. In recent years large fans or wind machines have been used to bring warmer upper air down to tree level when a condition of temperature inversion is present. Whatever the method of frost protection used, fuel of some sort is expended. With fuel shortages and greatly increased cost of fuel, the basic problem of orchard heating has become critical.

The problem presents itself then as to when to start up the frost protection system. When fuel was relatively inexpensive, many orchard owners or growers would "light up" early just to be on the safe side. However, a cold spring with many heating nights can be disastrously expensive. Each successive heating night reduces the grower's potential profit. Additionally, with today's high fuel costs and emphasis on conservation, the grower who unnecessarily operates his heating system, wastes both money and resources. From experience and research, it has been determined approximately what temperature a given fruit variety can stand at a given stage of its development. This might vary from 20° F. to 30° F. during the season. For example, if cherries at a given stage of development will stand 28°, the grower will "light up" at some point above 28° F. If the temperature drops below 28° F., he has saved enough of the crop to justify the heating expense. If he lights up at 29° F. and the temperature does not go below that, then he has wasted both fuel and money. In the past, the determination as to when to "light up" was based on hit and miss procedures dictated by monitoring the local weather forecast, by watching orchard thermometers set in the coldest area of the orchard, and by making use of one's own past experience. Frost protection as a result has become probably more of an "art" than a "science" and at best an inexact science.

It should also be noted with some emphasis that an orchard thermometer measures atmospheric temperature and not that of the trees themselves. Since the grower is interested in what is happening to the tree parts, measuring the ambient temperature by placing thermocouples, for example, on the tree bark would provide little more information than an indication of air temperature. Such measurements do not indicate the most pertinent piece of vital information and that is at what point does the tree tissue actually freeze.

It has been previously observed that tree tissue exhibits the phenomenon that its electrical resistance increases dramatically at the temperature at which freezing of the tissue occurs. This has been documented in a publication entitled "A Note on Electrical Resistance Measurements in Acer Saccharum" by D. S. Fensom, which appeared in the Canadian Journal of Botany, Volume 38, 1960, at pages 263 and 264 and in an article entitled "Freezing Patterns in Twigs of Evergreen Azalea", by G. P. Lumis, et al. which appeared in the Journal of the American Society of Horticultural Sciences, 99 (6), 1974 at pages 564–567. It is upon this observed characteristic that the present invention is based, as will be set forth subsequently.

A preliminary/patentability search has been conducted and the following references were noted and are hereby made of record:

U.S. Pat. Nos: 2,419,266; 2,717,957; 3,046,537; 3,182,914; 3,298,191; 3,463,396; 3,553,481; 3,594,775; 3,706,981; 3,777,976; 3,778,798; 3,891,979.

None of the above references is believed to be particularly pertinent to the subject invention. Typically, U.S. Pat. No. 3,298,191 discloses a solid state control system for the so-called ice bank on refrigeration coils with the operation of the system being in the utilization of a change of resistance when water changes to ice and the generation of a control signal. Accordingly in some other examples the irrigation systems are turned off and on in response to changes in variation in resistance of sub-surface sensors which are responsive to moisture content of the soil. Reference is accordingly made to U.S. Pat. Nos. 3,777,976; 3,182,914; 3,553,481; and 3,463,396.

SUMMARY

Briefly, the subject invention is directed to the method and apparatus for monitoring the freezing point of plant tissue and more particularly the tissue of fruit trees and the like and determining the occurrence of a predetermined change (sharp or step increase) in the electrical resistance of the tree tissue by embedding electrical probes into the tissue. The electrical resistance existing between the probes is used to control the frequency of an electrical signal generator such as a free running multivibrator whose square wave output signal is coupled to an electrical circuit which is adapted to detect the frequency during specific successive time periods, compare the frequency between these successive time periods, and in the event of a predetermined frequency difference therebetween, a signal is produced which if it recurs for a certain predetermined elapsed time indicative of the tissue freezing point being reached, provides an alarm or other type of annunciator or control signal. Circuitry implementing the last mentioned functions of frequency detection and comparison, etc. utilizes digital circuit modules which operate on the square wave output signal from the free running multivibrator.

DESCRIPTION OF THE PREFERRED EMBODIMENT

Prior to discussing the details of the subject invention, it should be pointed out that with respect to a tree orchard, the grower knows from experience that it normally includes an area which becomes initially colder than the remainder. A tree in such an area is selected as the indicator or freeze warning station.

Figure 1:
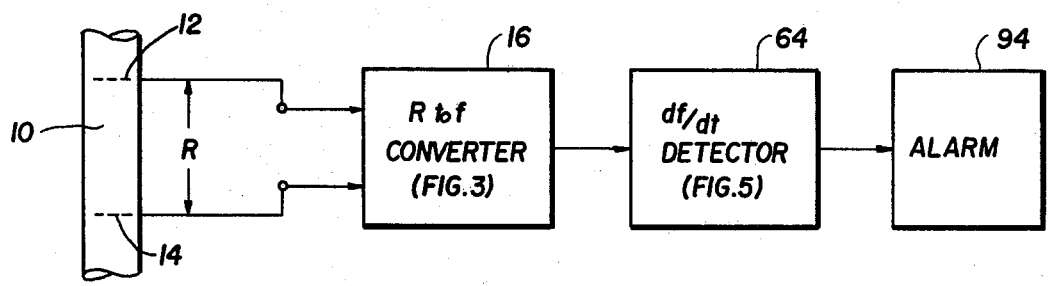
FIG. 1 is an electrical block diagram broadly illustrative of the preferred embodiment of the subject invention.
Figure 2:
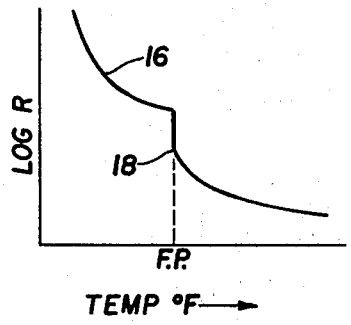
FIG. 2 is a curve illustrative of the electrical resistance characteristic of tree tissue in the region of its freezing point.

Referring now to the drawings, reference is first made to FIG. 1 wherein reference numeral 10 denotes a tree limb for example, of the indicator tree referred to above, into which a pair of needle-like metallic electrical probes 12 and 14 are inserted or embedded deep into the limb's tissue. An electrical resistance of the magnitude R exists between the probes 12 and 14, which has the characteristic as shown in FIG. 2. The logarithmic curve shown in FIG. 2 indicates that the resistance R is inversely proportional to temperature meaning that the resistance increases as the temperature decreases. More importantly, however, the resistance characteristic curve 16 shown in FIG. 2 includes an abrupt change at the region 18, which corresponds to the freezing point of the limb tissue between the probes 12 and 14.

Accordingly, the probes 12 and 14 are coupled to an electrical signal generator circuit 16 which is responsive to the magnitude of the resistance R and provides a time varying electrical output signal such as a square wave whose frequency f is dependent upon the magnitude of the resistance R. The circuit 16 is thus intended to embody a resistance to frequency converter which is shown in detail in FIG. 3.

Figure 3:
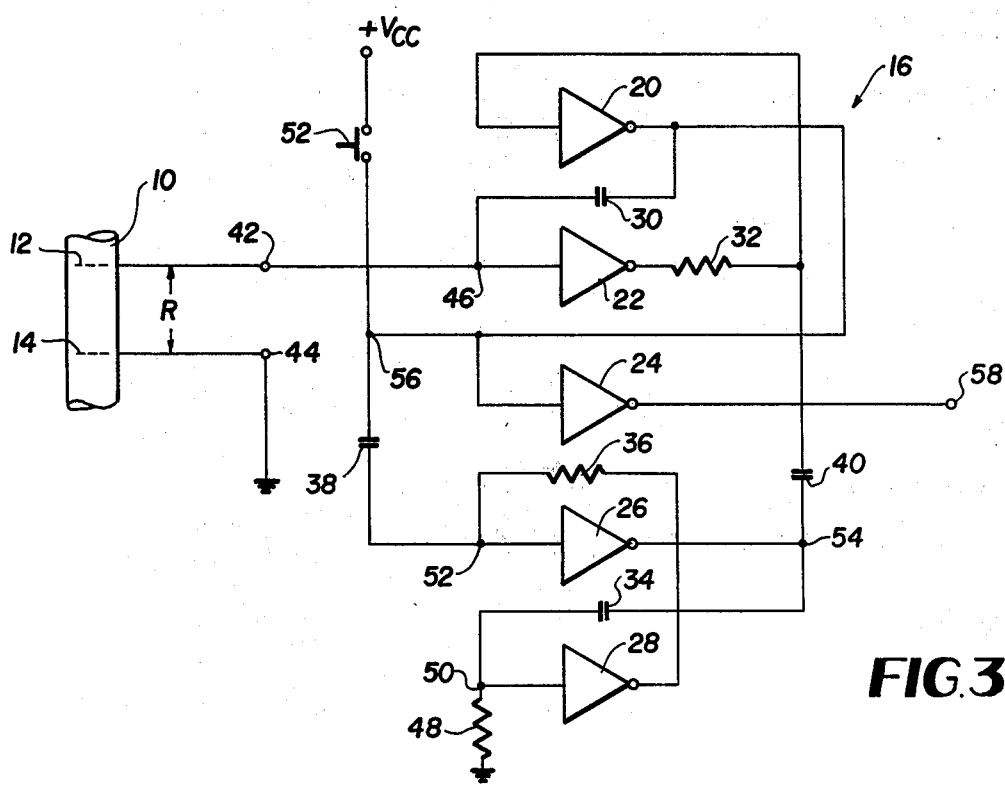
FIG. 3 is an electrical circuit diagram illustrative of the tissue resistance to frequency converter shown in block diagrammaticaly in FIG. 1.

Referring now to FIG. 3, the signal generator circuit 16 in its preferred form comprises a free running multivibrator, a circuit well known to those skilled in the electrical arts, but one which is herein configured from active solid state integrated circuit devices, including CMOS or field effect devices which are particularly suitable for the megohm resistance values encountered in the instant application. The circuitry shown in FIG. 3 includes five high impedance CMOS inverter signal amplifiers 20, 22, 24, 26, 28, which operate with relatively little power drain while permitting monitoring of tree tissue resistances, and which are interconnected in the following fashion. The output of amplifier 20 is coupled back to the input of amplifier 22 by means of a capacitor 30 while the output of amplifier 22 is coupled back to the input of amplifier 20 by means of resistor 32. Likewise with respect to amplifiers 26 and 28, the output of amplifier 26 is coupled to the input of amplifier 28 by means of capacitor 34 while the output of amplifier 28 is coupled back to the input of amplifier 26 by means of resistor 36. The interconnected amplifiers 20 and 22 are connected to the amplifiers 26 and 28 by means of capacitors 38 and 40. The resistance R between the probes 12 and 14 is connected to the circuit 16 by means of the pair of terminals 42 and 44, which connect to circuit junction 46 at a point of reference potential illustrated and ground, respectively. In a manner like the resistance R, a fixed value resistor 48 is also connected to ground potential, but has its opposite end connected to circuit junction 50, which is common to capacitor 34 and the input to amplifier 28.

Figure 4:
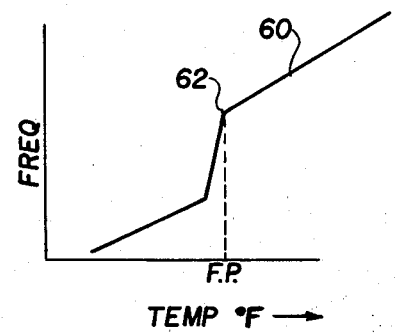
FIG. 4 is a frequency vs. temperature curve illustrative of the operation of the system shown in FIG. 1.

Operation is initiated by momentary actuation of push button switch 52, which is connected between a reference supply potential $+V_{cc}$ and at circuit junction 56. This causes the voltage potential at junction 56 to go to $+V_{cc}$ as well as circuit junction 52 due to the presence of capacitor 38. Circuit junction 54 is driven negative by means of the action of inverter amplifier 26, which due to capacitor 40 drives input to inverter amplifier 20 negative. This action through the interconnection of inverter amplifier 20 latches circuit junction 56 to potential $+V_{cc}$ until the potential at circuit junction 46 drops to the voltage threshold of the amplifier 22, at which time the actions reverse. This reversal causes circuit junction 56 to drop to zero potential which through capacitor 38 initiates an identical sequence of actions by the amplifiers 26 and 28 and its associated components. At the completion of the sequence, circuit junction 56 will again rise to potential $+V_{cc}$, and the action will be reinitiated. By means of the inverter amplifier 24 coupled to junction 56, an output square wave will appear at circuit junction terminal 58, whose on and off times are controlled by the values of capacitor 34 in combination with resistor 48 as well as capacitor 30 and the resistance R. Inasmuch as all of the values of the frequency controlling components are fixed with the exception of the resistance R between the probes 12 and 14, the frequency of the output square wave is proportional to the value of the resistance R. Thus the resistance R is converted to an AC signal having a frequency f, the variation of which is characterized by the curve 60 (FIG. 4). It should be observed that the curve has a break point 62 where the frequency abruptly changes to a lower magnitude at the freezing point of the tissue under test. The variable frequency square wave which is a function of R and appearing at circuit junction 58 is fed to a frequency rate of change detector circuit 64 which is shown in detail in FIG. 5.

Figure 5:
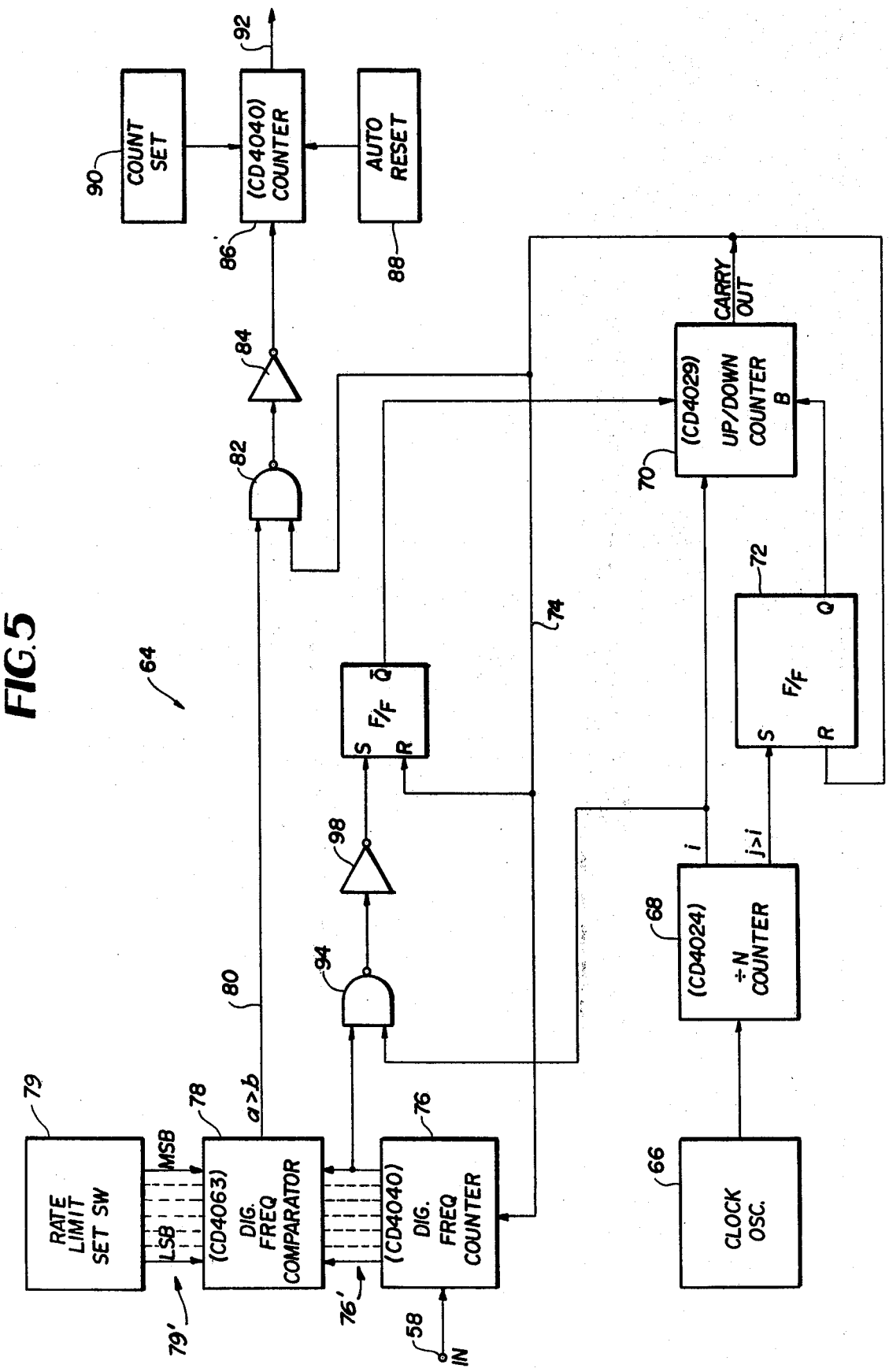
FIG. 5 is an electrical circuit diagram illustrative of the frequency rate of change detector circuit shown in FIG. 1.

Referring now to FIG. 5, a digital implementation of a frequency rate of change detector is disclosed which is responsive to the square wave output from the circuit 16 to determine the abrupt change in frequency as shown by the characteristic curve in FIG. 4, while at the same time being insensitive to spurious cases which might tend to produce false alarms. The configuration shown in FIG. 5 includes a clock oscillator 66 of any selected design which is adapted to generate a clock pulse train which is fed into a binary counter 68 typically a CD4024 (a generic part number manufactured and similarly identified by several manufacturers) whereupon a suitable frequency division is selected to feed pulses of a frequency i to an up/down counter 70, which has for its purpose the generation of two successive equal time periods within which the output frequency of the signal generator circuit 16 is to be measured and compared. A flip-flop circuit 72 is coupled between the frequency divider counter 68 and the up/down counter 70 for establishing the two successive time periods. The flip-flop circuit 72 is set by a pulse train j>i from the counter 68 causing its Q output to reset the counter 70 in one direction, which upon completion of a predetermined count of the i pulse train produces a CARRY OUT signal which resets the flip-flop 72 causing the Q signal to cause the counter 70 to start counting in the opposite direction. Thus after N pulses of the i pulse train, the count direction is changed by means of the action of the flip-flop 72, thus providing two consecutive time periods of equal length.

Next the square wave output from the free running multivibrator signal generator circuit 16 (FIG. 3) appearing at circuit terminal 58 is fed into a digital binary counter 76, typically a CD4040 type integrated circuit module which is adapted to count the frequency of the square wave pulses during each period established by the up/down counter 70. Coupled to the frequency counter 76 is a digital frequency comparator 78 comprised of a plurality of CD4063 integrated circuit modules wired in series to accommodate a selected multi-digit binary number.

Accordingly, the square wave signal frequency corresponding to the resistance R between the probes 12 and 14 is continually sampled during equal time periods A and B established by the up/down counter 70. The count measured during the first time period A is compared to that taken during an identical second time period B. This is accomplished by means of the counter 76 and the frequency comparator 78. The parameters are preset to accommodate normal frequency change during non-freezing cool down conditions by means of a rate limit switch 79. However, when the tissue freezes, its resistance R sharply increases at region 18 as shown in FIG. 2, at which time a correspondingly sharp change i.e. reduction of frequency occurs as shown in FIG. 4. Under these conditions, the count accumulated during the second time period B is less than that of the first time period A. The comparator 78 detects this significant difference and outputs a signal on signal lead 80.

The rate limit switch 79 is a simple well-known binary switch which enables one to selectively input a predetermined multi-bit binary number "count a" having a least significant bit (LSB) and a most significant bit (MSB) to the frequency comparator 78 by means of digital data lines 79'. The most significant bit of "count a" provides a count value corresponding to the frequency and tolerance value expected for the first time period A. During this time period, the frequency counter 76 accordingly inputs a substantially equal multi-bit binary number to the comparator 78 via digital data lines 76' resulting in a null output on line 80. Following period A, i.e. period B, the counting of the frequency continues in counter 76 inputting a "count b" on data lines 76' which is compared against "count a" which is still being applied from the binary rate limit switch 79. If the binary value set in the rate limit switch is greater than the count output of counter 76 during period B, then a signal a>b signal status appears on line 80 indicating a predetermined frequency change has occurred.

This signal is interrogated by a logical NAND circuit 82 which receives as its other input, the CARRY OUT signal from the up/down counter 70 to apply an alarm count pulse via a logic inverter circuit 84 to an alarm event counter 86 having an automatic reset circuit 88 connected thereto as well as a manual limit count set circuit 90.

If the act of freezing is actually occurring as opposed to spurious signals, a pulse signal will be outputted from comparator 78 at the end of each second time period B and since freezing takes several minutes, many signals will be generated and outputted on circuit lead 80 to the counter 86 which if the preset count as established by the count set circuit 90 is exceeded prior to automatic reset, a signal will be provided at the output signal lead 92, which is adapted to activate a suitable alarm circuit 94 shown in FIG. 1 or provide a predetermined control function e.g. energize heating apparatus.

In the event that maximum frequency count of the counter 76 is reached prior to the end of the specific time period, a signal is coupled to NAND circuit 94 which sets a second flip-flop circuit 96 by way of a logic inverter 98 which causes the $\overline{Q}$ output signal to be coupled to the up/down counter for prematurely resetting the up/down counter 70.

Thus what has been shown and described is a monitoring method and apparatus for determining the tissue freezing point of a limb of a tree which has been designated the freeze warning station. The freezing point is established by detecting the drastic change in electrical resistance of the tissue which is converted to a digital frequency, which is thus proportional to the resistance monitored. By comparing the frequency for successive equal time periods and noting a sharp rate of change of frequency an alarm signal accordingly is generated which can either alert the grower to take appropriate action or automatically activate appropriate heating apparatus so that the remaining trees can be protected.

While the present invention has been described with respect to a digital implementation of a monitoring system, it should be appreciated that when desirable, an analog system can be provided whereby the variable frequency output from the circuit 16 is converted to an analog signal which is then appropriately utilized so as to effect the desired control function.

Having thus described what is at present considered to be the preferred embodiment of the subject invention, I claim:

1. The method of monitoring the freezing point in the tissue of fruit trees and other plants, comprising the steps of:
    internally sensing the electrical resistance of a selected region of said tissue;
    converting the electrical resistance sensed into another electrical quantity which is proportional to the electrical resistance sensed;
    monitoring said electrical quantity and detecting a predetermined rate of change of the magnitude of said electrical quantity which is indicative of an abnormal step like increase in said electrical resistance; and
    providing an output signal for purposes of activating an alarm or providing a control function in response to the detected predetermined rate of change.

2. The method as defined by claim 1 and additionally including the step of initially selecting at least one of a plurality of like trees as a freeze warning station in an area which becomes initially colder than the remainder of said trees and applying sensing means to a selected portion of said at least one tree.

3. The method as defined in claim 1 wherein said step of detecting is performed a plurality of times sequentially for each of a predetermined number of sensing time periods to determine if said predetermined rate of change has occurred.

4. The method as defined by claim 1 wherein said sensing step comprises inserting means into the plant tissue for defining said selected region.

5. The method as defined by claim 1 wherein said step of converting comprises converting the electrical resistance sensed into a time varying electrical signal whose frequency is caused to change as a function of the electrical resistance sensed.

6. The method as defined by claim 5 wherein said step of detecting the predetermined rate of change consists in detecting the frequency of said electrical signal for at least two successive equal time periods, comparing the frequencies detected in said time periods, and generating an intermediate output signal when the frequency measured during any said time period deviates by a predetermined magnitude from the frequency of the immediately preceding time period.

7. The method as defined by claim 6 and wherein said step of providing said output signal consists in providing said output signal following a selected plurality of intermediate output signals which is indicative of a freezing condition existing over a length of time which is greater in length than two successive time periods.

8. The method as defined by claim 1 wherein said step of converting comprises generating a digital signal whose frequency is proportional to the electrical resistance sensed, and wherein said step of detecting comprises the step of digitally detecting a predetermined rate of change of the frequency of said digital signal by digitally measuring frequency during a succession of equal time intervals, digitally comparing the frequencies detected during successive intervals and outputting a digital signal for a predetermined frequency difference.

9. Apparatus for monitoring the freezing point in the tissue of fruit trees and other plants comprising in combination:

means selectively inserted into said tissue for sensing the electrical resistance of a region of tissue, said electrical resistance varying in accordance with the temperature of said tissue;

electrical signal generator means coupled to said means inserted in the plant tissue and being responsive to said electrical resistance to provide a regular time varying electrical signal having a frequency which varies in response to and as a function of the change in said electrical resistance; and circuit means coupled to said electrical signal generator means and being responsive to said electrical signal to detect a predetermined rate of change of frequency corresponding to an abnormal step like change in said electrical resistance which occurs at the freezing point of said tissue and provide an output signal which is adapted to initiate an alarm and/or activate suitable control apparatus for raising the ambient temperature above said freezing point.

10. The apparatus as defined by claim 9 wherein said means inserted in said tissue comprises a pair of electrical probes.

11. The apparatus as defined by claim 10 wherein said electrical signal generator means comprises a resistance controlled oscillator circuit having a control resistance which comprises the electrical resistance of the tissue between said probes.

12. The apparatus as defined by claim 11 wherein said resistance controlled oscillator comprises a free running multivibrator circuit.

13. The apparatus as defined by claim 9 wherein said circuit means comprises:

first circuit means generating timing signals for defining at least two consecutive equal time periods;

second circuit means coupled to said electrical signal generator means and being operable in response to said timing signals to measure the frequency of the output of said signal generator means for each of said at least two time periods;

third circuit means coupled to said second circuit means and being operable to compare the frequencies measured in consecutive time periods and provide an intermediate output signal for a predetermined frequency difference; and fourth circuit means coupled to said third circuit means and being responsive to said intermediate output signal to provide said output signal for a plurality of intermediate output signals occurring for a predetermined elapsed time interval.

14. The apparatus as defined by claim 9 wherein said circuit means comprises:

a digital frequency counter coupled to said electrical signal generator means;

digital frequency comparator means coupled to said frequency counter and being operative to compare the content of the frequency counter for two successive equal time intervals and provide a digital signal when the count accumulated by said counter during the second time interval is less by a predetermined magnitude than the count accumulated in the first time interval; and means coupled to said comparator means and being responsive to said digital output signal to produce said output signal.

15. The apparatus as defined by claim 9:

wherein said electrical signal generator means provides a digital output signal, and wherein said circuit means comprises digital circuit means including clock circuit means for providing timing signals for defining successive equal time periods, digital frequency measuring means coupled to said signal generator means and providing a digital frequency measurement output signal for each time period, digital comparator means coupled to said frequency measuring means and being responsive to said digital output signal to provide an intermediate digital output signal for a predetermined frequency difference between two consecutive time periods, said predetermined difference corresponding to an abrupt change in the resistance characteristic of said tissue at the freezing point thereof, and digital circuit means coupled to said frequency comparator to output a control signal for a predetermined number of output signals from said frequency comparator over a predetermined elapsed time.

16. The apparatus as defined by claim 15 wherein said digital frequency measuring means comprises a digital counter adapted to count the number of digital output signals from said signal generator means during each said time period.

17. The apparatus as defined by claim 16 wherein said clock circuit means comprises a clock oscillator, an up/down counter coupled thereto and circuit means coupled to said clock oscillator and said up/down counter and being operable in response to pulses supplied by said clock oscillator and said up/down counter to periodically reverse the count of said up/down counter and thereby provide said timing signals corresponding to successive equal time periods.

* * * * *